(12) United States Patent
Takei

(10) Patent No.: US 7,418,681 B2
(45) Date of Patent: Aug. 26, 2008

(54) SIMULATION SYSTEM, SIMULATION METHOD AND SIMULATION PROGRAM FOR VERIFYING LOGIC BEHAVIOR OF A SEMICONDUCTOR INTEGRATED CIRCUIT

(75) Inventor: Tsutomu Takei, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 303 days.

(21) Appl. No.: 11/193,836

(22) Filed: Jul. 28, 2005

(65) Prior Publication Data

US 2006/0052994 A1    Mar. 9, 2006

(30) Foreign Application Priority Data

Aug. 6, 2004    (JP)    ............................ P2004-231289

(51) Int. Cl.
    *G06F 17/50*    (2006.01)
(52) U.S. Cl. ............................................. 716/5; 716/4
(58) Field of Classification Search .................. 716/3–5, 716/18; 703/14, 23, 15
    See application file for complete search history.

(56) References Cited

U.S. PATENT DOCUMENTS

| | | | | |
|---|---|---|---|---|
| 6,536,031 | B2 * | 3/2003 | Ito et al. ........................ | 716/18 |
| 7,006,960 | B2 * | 2/2006 | Schaumont et al. ............ | 703/15 |
| 7,120,571 | B2 * | 10/2006 | Shei et al. ...................... | 703/23 |
| 7,194,705 | B1 * | 3/2007 | Deepak et al. .................. | 716/3 |
| 2005/0198606 | A1 * | 9/2005 | Gupta et al. .................... | 716/18 |

OTHER PUBLICATIONS

Michel, et al., "The Synthesis Approach To Digital System Design," Kluwer Academic Publishers, pp. 115-219, Chapter 6—High Level Synthesis, ISBN 0-7923-9199-3, (1992-1993).
Raemen, et al., "Note On Naming," pp. 1-2, (2003); AES Proposal: Rijndael, Document Version 2, pp. 1-45, (1999).
Ki, et al., "Cycle-Accurate Co-Emulation With SystemC," SoC Design Conference 2003, Coex Asem Hall, Seoul, Korea, pp. 1-4, (2003).
Accelera, "Standard Co-Emulation Modeling Interface (SCE-MI) Reference Manual Draft," Version 1.0, pp. 1-95, (2003).
System C, Version 2.0, User's Guide, Update For SystemC 2.0.1 (1996-2002).
Eve, "SoC Verification With ZeBu," Version 4, pp. 1-8, (2004).

* cited by examiner

*Primary Examiner*—Vuthe Siek
(74) *Attorney, Agent, or Firm*—DLA Piper US LLP

(57) ABSTRACT

A simulation system for verifying logic behavior of a semiconductor integrated circuit includes a reprogrammable semiconductor device having an interface circuit and a logic circuit; and an analyzing unit dividing a logic behavior of the semiconductor integrated circuit into a software-based first logic behavior and a hardware-based second logic behavior and generating circuit data of the interface circuit included in the first logic behavior that exhibits an input/output behavior and circuit data of the logic circuit that exhibits the second logic behavior.

20 Claims, 13 Drawing Sheets

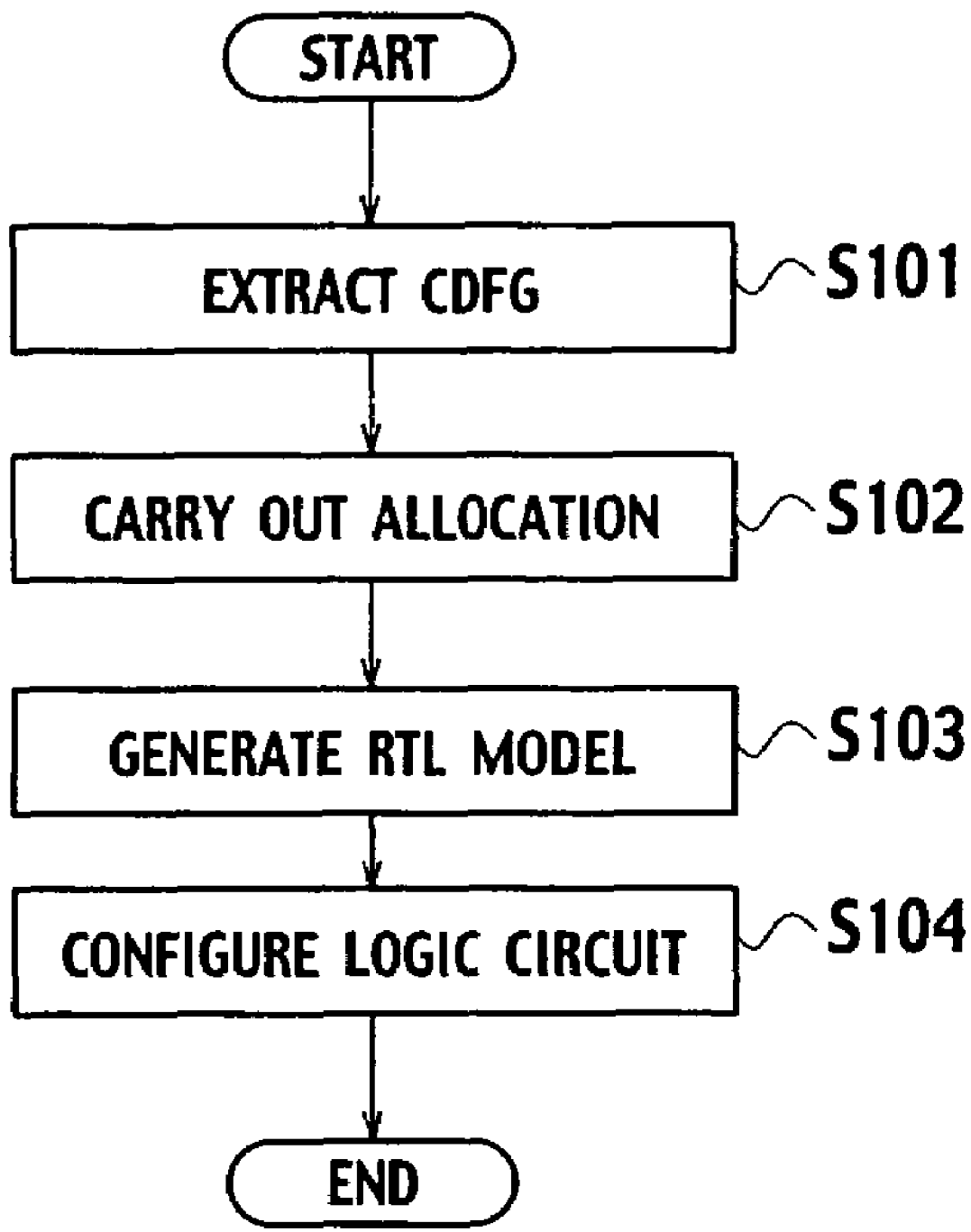

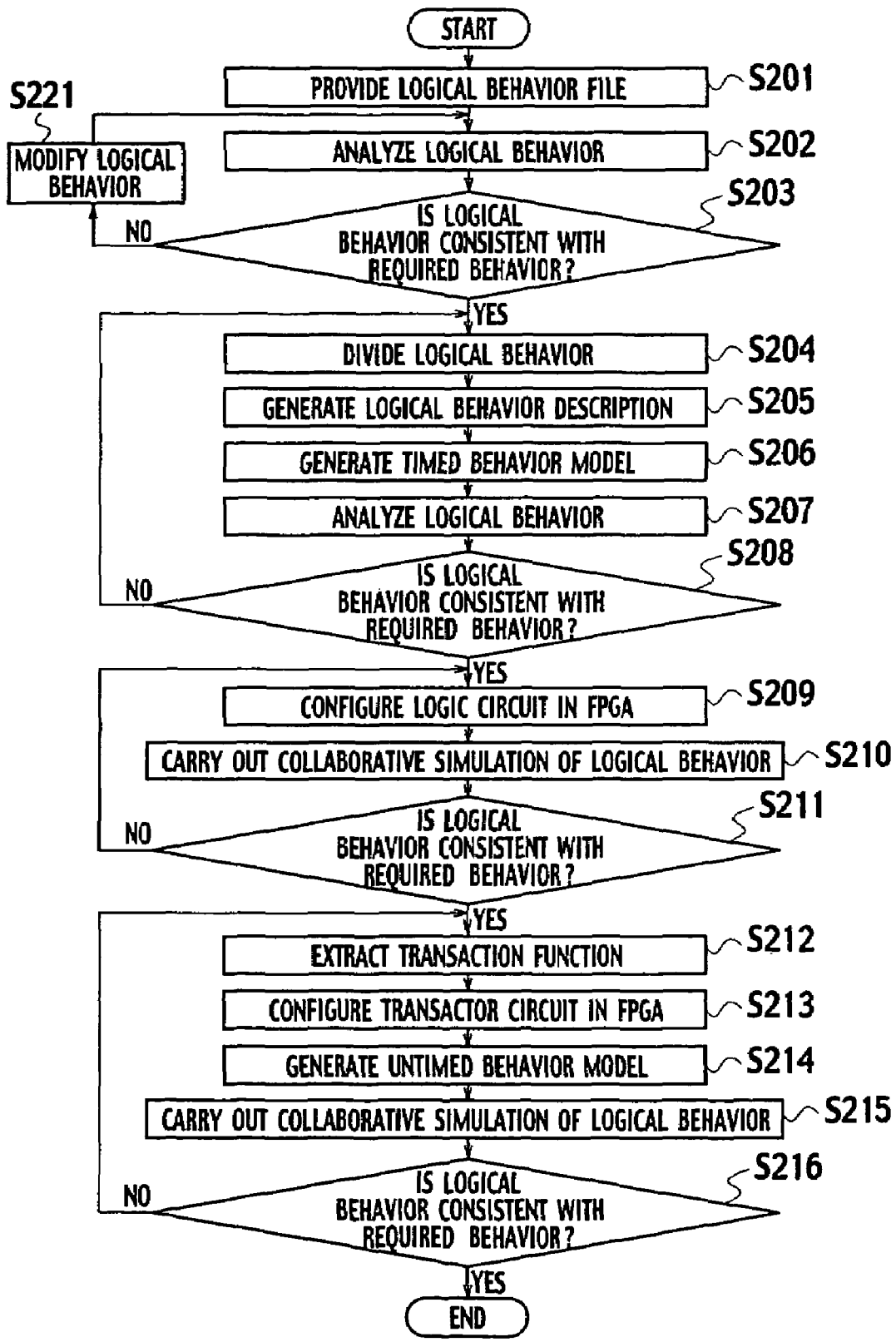

FIG. 5

```
int rijndaelEncrypt (word8 a[MAXBC][4], int keyBits, int blockBits,
                    word8 rk[MAXROUNDS+1][MAXBC][4])
    int r, BC, ROUNDS;
    AddRoundKey(a,rk[0],BC);
    for(r = 1; r < ROUNDS; r++) {
                Substitution(a,S,BC);
                ShiftRows(a,0,BC);
                MixColumns(a,BC);
                AddRoundKey(a,rk[r],BC);
    }
......
```

FIG. 6

```
#define MAXBC                                    (256/32)
#define MAXKC                                    (256/32)
#define MAXROUNDS                  14
typedef unsigned char              word8;
typedef unsigned short             word16;
typedef unsigned long              word32;
extern int rijndaelKeySched (word8 k[MAXKC][4], int keyBits, int blockBits,
word8 rk[MAXROUNDS+1][MAXBC][4]);
extern int rijndaelEncrypt (word8 a[MAXBC][4], int keyBits, int blockBits,
word8 rk[MAXROUNDS+1][MAXBC][4]);
......
```

FIG. 7

```
for (k = 0; k < 4; k++)
    for (j = 0; j < 4; j++) {
                cip1[k][j] = ae[i][k][j];
    }
pr_data("CIP[In ] = ", 16, cip1);
rijndaelEncrypt(cip1, 128, 128, internal_exkey);
......
```

FIG. 9

```
/** aes4_hw.cpp **/
#include <systemc.h>
#include "aes4_hw.h"
#include "aes4_hw_const.h"
void aes4_hw::entry(void) {
sc_uint<5>   t, rconpointer;
sc_uint<8>   tk[4][4];
sc_uint<8>   k[4][4];
sc_uint<32>  tmp_in1, tmp_in2, tmp_in3, tmp_in4;
sc_uint<8>   exk[11][4][4];
  ......
```

FIG. 10

```
/** aes4_hw.h **/
#include "systemc.h"
typedef unsigned char                   word8;
SC_MODULE(aes4_hw) {
    sc_in_clk    CLK;
    sc_in<bool>  reset;
    sc_in<bool>  key_ready;     //added for handshake
  ......
```

FIG. 11

```
#include <systemc.h>
#include "stimulus_display.h"
   static  word8 cip[8][4];
   static  unsigned int tmp1, tmp2, tmp3, tmp4;
   ......
for (k = 0; k < 4; k++)
     for (j = 0; j < 4; j++) {
             cip1[k][j] = ae[i][k][j];
     }
  do_hs_cip(cip1);
  ......
```

FIG. 12

```
SC_MODULE(stimulus_display) { sc_out<bool>  reset;
sc_out<bool>  key_ready;
sc_out<bool>  cip_ready;
sc_out<sc_uint<32> >  data_in;
  ......
```

FIG. 13

```
int sc_main (int argc , char *argv[]) {
  sc_clock         clock;
  sc_signal<bool> reset;
  sc_signal<bool> key_ready;
  sc_signal<bool> send_key;
  ......
```

FIG. 14

```
SC_MODULE(aes4_hw_wrapper) {
  sc_in<bool> CLK;
  sc_in<bool> reset;
  sc_in<bool> key_ready;
  sc_in<bool> cip_ready;
  sc_in<sc_uint<32> > data_in;
  sc_in<bool> result_seen;
  sc_out<bool> send_key;
  sc_out<bool> send_cip;
  sc_out<bool> result_ready;
  sc_out<sc_uint<32> > data_out;
  void do_aes4_hw_CLK_wrapper();
  SC_HAS_PROCESS(aes4_hw_wrapper);
  aes4_hw_wrpper(sc_module_name name, char* edf) : sc_module(name)
  {
    _edf = new char[strlen(edf)+1]; sc_assert(_edf!=NULL);

......

wait();
```

FIG. 15

```
void stimulus_display::do_hs_key(unsigned char key1[4][4])
{
  wait_until(send_key.delayed() == true);

send_value1 = ((key1[0][0] << 24) & 0xff000000) | ((key1[0][1] << 16) & 0x00ff0000) |
((key1[0][2] << 8) & 0x0000ff00) | (key1[0][3] & 0x000000ff);
  key_ready.write(true);
  data_in.write( (unsigned int)send_value1 );
  wait();
  ......
```

FIG. 16

```
int do_hs_key_trans(unsigned char key1[4][4])
{
  unsigned int send_value[4];

send_value[0] = 0x00000001;
  Zt_aes4_hw.write_cmd (send_value[0]);
  ......
  return    0;
```

FIG. 17

```
                START
                  ↓
    EXTRACT CDFG IN TRANSACTOR FUNCTION      ─── S301
                  ↓
           CARRY OUT ALLOCATION              ─── S302
                  ↓
    GENERATE RTL MODEL OF TRANSACTION CIRCUIT ─── S303
                  ↓
                 END
```

FIG. 18

```
{
{Num_of_TransFunc = 3;
  {do_hs_key;
   do_hs_cip;
   do_hs_result;}
}

{Num_of_Generated_Transactor = 1;          ←
 {Name_of_transactor = Zt_aes4_hw;}

{Num_of_Port_Instance = 4;
  {SceMiMessageInPort : Cmd_inport,
      message[127:0] : Cmd_inport_message[127:0];
          Num_of_Func = 0;
  }
   ......
}
```

FIG. 19

```
{
 {Num_of_TransFunc = 3;
  {do_hs_key;
   do_hs_cip;
   do_hs_result;}
 }

{Num_of_Generated_Transactor = 3;      ←
  {
   Name_of_Top_transactor = Zt_aes4_hw;
   {Num_of_Port_Instance = 0;}
   {Num_of_Instance = 2;
    {Zt_aes4_in : Zt_aes4_in_inst}
    {Zt_aes4_out : Zt_aes4_out_inst}
   }
   ......
  }
```

SIMULATION SYSTEM, SIMULATION METHOD AND SIMULATION PROGRAM FOR VERIFYING LOGIC BEHAVIOR OF A SEMICONDUCTOR INTEGRATED CIRCUIT

CROSS REFERENCE TO RELATED APPLICATIONS AND INCORPORATION BY REFERENCE

This application is based upon and claims the benefit of priority from prior Japanese Patent Application P2004-231289 filed on Aug. 6, 2004; the entire contents of which are incorporated by reference herein.

BACKGROUND OF THE INVENTION

1. Field of the Invention

The present invention relates to a method for verifying logic behavior of a semiconductor integrated circuit. More specifically, it relates to a simulation system, a simulation method and a simulation program for verifying logic behavior of a semiconductor integrated circuit by dividing the logic behavior into hardware-based logic behavior and software-based logic behavior.

2. Description of the Related Art

The duration of logic behavior verification for designing a large scale integrated circuit (LSI) with increased scale and complexity has been increasing. In addition, to improve reliability of such logic behavior verification, it is necessary to increase verification speed, verify in an upper level design, and verify by using an actual devices or functional blocks.

There is an LSI logic behavior simulation method using highly abstract behavior models, which allow high-speed analysis and logic behavior verification in early stages of design. More specifically, firstly, LSI logic behavior is divided into hardware-based logic behavior and software-based logic behavior. The hardware-based logic behavior is simulated using actual hardware. The software-based logic behavior is simulated using software simulator. Secondly, the hardware-based logic behavior is written using highly abstract behavior models. Afterwards, the logic behavior is verified using the highly abstract behavior models.

Alternatively, LSI logic behavior simulation using a reprogrammable semiconductor device, such as a field programmable gate array (FPGA), has been increasingly used as a logic behavior verification method. More specifically, a logic circuit exhibiting the hardware-based logic behavior of LSI logic behavior is configured in the FPGA. Behavior models for software-based logic behavior are written in C/C++ language or the like. A behavior analyzing unit that simulates logic behavior of behavior models is electrically connected to a circuit board on which a logic circuit configured FPGA is mounted, thereby carrying out LSI logic behavior simulation. In the following, logic behavior simulation using behavior models written in C/C++ language and a logic circuit configured in the FPGA is referred to as 'collaborative simulation'. Logic behavior simulation using FPGA can detect, in an early stage, malfunctions that will occur when using actual components. There are two collaborative simulation methods:

(1) Software-based logic behavior is written as behavior models operating in sync with an operating clock. The collaborative simulation is then carried out while synchronizing the operating clock for the behavior models with the operating clock of the logic circuit configured in the FPGA and transferring data between the logic circuit and the behavior models.

(2) Software-based logic behavior is written as behavior models not operating in sync with the operating clock. An interface circuit for data transfer between the logic circuit and the behavior models is configured in the FPGA. The collaborative simulation is carried out using the behavior models, the logic circuit, and the interface circuit for data transfer.

Since the method (1) does not need to generate the interface circuit, no time is spent for initiating the collaborative simulation. However, collaborative simulation speed is slow due to limits of the operating clock speed for the behavior models. On the other hand, collaborative simulation speed is faster according to the method (2). However, substantial labor is required to generate the interface circuit.

SUMMARY OF THE INVENTION

An aspect of the present invention inheres in a simulation system for verifying logic behavior of a semiconductor integrated circuit. The system includes a reprogrammable semiconductor device having an interface circuit and a logic circuit. The system also includes an analyzing unit configured to divide a logic behavior of the semiconductor integrated circuit into a software-based first logic behavior and a hardware-based second logic behavior and to generate circuit data of an interface circuit included in the first logic behavior that exhibits an input/output behavior and circuit data of a logic circuit that exhibits the second logic behavior. The analyzing unit verifies the logic behavior of the semiconductor integrated circuit including the logic circuit, the interface circuit, and an untimed behavior model exhibiting the first logic behavior in which time related information is unspecified.

Another aspect of the present invention inheres in a simulation method for verifying logic behavior of a semiconductor integrated circuit. The method includes dividing a logic behavior of the semiconductor integrated circuit into a software-based first logic behavior and a hardware-based second logic behavior, generating circuit data of a logic circuit exhibiting the second logic behavior, and configuring the logic circuit in a reprogrammable semiconductor device based on the circuit data of the logic circuit, generating circuit data of an interface circuit exhibiting input/output behavior included in the first logic behavior, and configuring the interface circuit in the reprogrammable semiconductor device based on the circuit data of the interface circuit, and verifying the logic behavior of the semiconductor integrated circuit using the logic circuit, the interface circuit, and an untimed behavior model exhibiting the first logic behavior in which time related information is unspecified.

Still another aspect of the present invention inheres in a computer program product for verifying logic behavior of a semiconductor integrated circuit. The computer program product includes instructions configured to divide a logic behavior of the semiconductor integrated circuit into a software-based first logic behavior and a hardware-based second logic behavior, instructions configured to generate circuit data of a logic circuit exhibiting the second logic behavior, and configure the logic circuit in a reprogrammable semiconductor device based on the circuit data of the logic circuit, instructions configured to generate circuit data of an interface circuit exhibiting input/output behavior included in the first logic behavior, and configuring the interface circuit in the reprogrammable semiconductor device based on the circuit data of the interface circuit. Other instructions are configured to verify the logic behavior of the semiconductor integrated circuit using the logic circuit, the interface circuit, and an untimed behavior model exhibiting the first logic behavior in which time related information is unspecified.

BRIEF DESCRIPTION OF DRAWINGS

FIG. 3 is a flowchart explaining a method for configuring a circuit in an FPGA according to the first embodiment of the present invention;

FIG. 4 is a flowchart explaining a simulation method according to the first embodiment of the present invention;

FIG. 5 shows an exemplary main description of a logic behavior verified using the simulation method according to the first embodiment of the present invention;

FIG. 6 shows an exemplary header of a logic behavior verified using the simulation method according to the first embodiment of the present invention;

FIG. 7 shows an exemplary testing description verified using the simulation method according to the first embodiment of the present invention;

FIG. 9 shows an exemplary main description of a behavior description generated using the simulation method according to the first embodiment of the present invention;

FIG. 10 shows an exemplary header of a behavior description generated using the simulation method according to the first embodiment of the present invention;

FIG. 11 shows an exemplary main description of a testing description generated using the simulation method according to the first embodiment of the present invention;

FIG. 12 shows an exemplary header of a testing description generated using the simulation method according to the first embodiment of the present invention;

FIG. 13 shows an exemplary inter-module connection behavior description included in the testing description generated using the simulation method, according to the first embodiment of the present invention;

FIG. 14 is an exemplary wrapper description generated using the simulation method according to the first embodiment of the present invention;

FIG. 15 is an exemplary transaction function description generated using the simulation method according to the first embodiment of the present invention;

FIG. 16 is an exemplary call description generated using the simulation method according to the first embodiment of the present invention;

FIG. 17 is a flowchart explaining a method of generating an RTL model for a transactor circuit according to the first embodiment of the present invention;

FIG. 18 shows an exemplary description of constraints according to the simulation method of the first embodiment of the present invention;

FIG. 19 shows an exemplary description of constraints according to the simulation method of the first embodiment of the present invention;

DETAILED DESCRIPTION OF THE INVENTION

Figure 1:
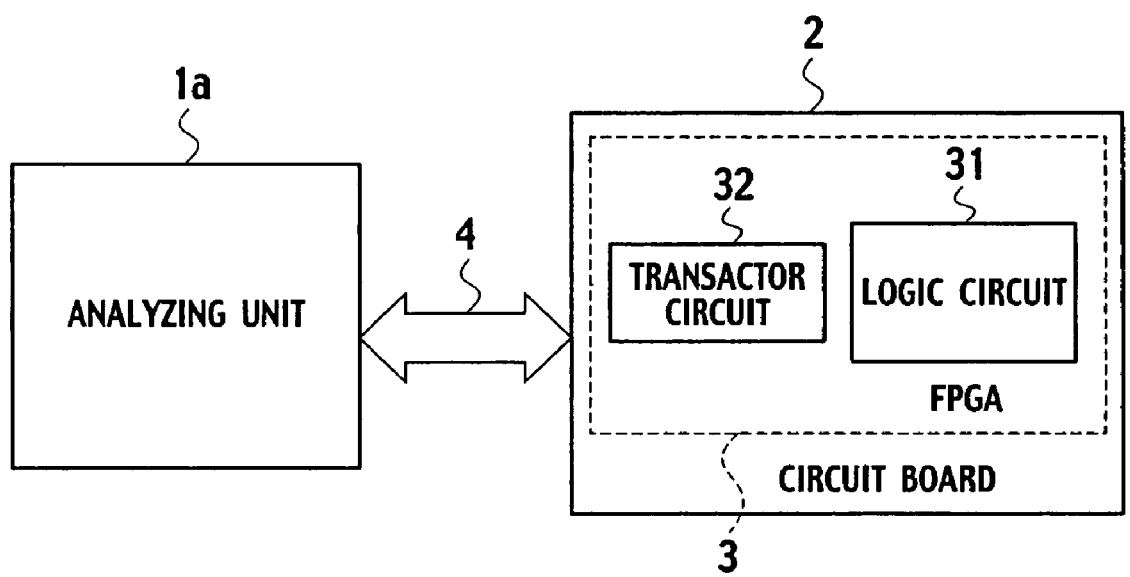
FIG. 1 shows a schematic structure of a simulation system according to a first embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

In the following descriptions, numerous specific details are set forth such as specific signal values, etc. to provide a thorough understanding of the present invention. However, it will be obvious to those skilled in the art that the present invention may be practiced without such specific details. In other instances, well-known circuits have been shown in block diagram form in order not to obscure the present invention in unnecessary detail.

First Embodiment

As shown in FIG. 1, a simulation system, according to a first embodiment of the present invention, includes an analyzing unit 1a and a circuit board 2.

The analyzing unit 1a divides the logic behavior of an LSI that is to be verified into software-based first logic behavior and hardware-based second logic behavior. The analyzing unit 1a generates circuit data of an interface circuit that exhibits an input/output behavior included in the first logic behavior and logic circuit data of a logic circuit exhibits the second logic behavior.

An FPGA 3, peripheral circuits such as a power supply circuit for activating the FPGA 3, which is not shown in the drawing, and connectors for connecting the circuit board 2 and the analyzing unit 1a, which is not shown in the drawing, are deployed on the circuit board 2. A logic circuit 31 and a transactor circuit 32 are configured in the FPGA 3 based on the circuit data generated by the analyzing unit 1a. The logic circuit 31 exhibits the second logic behavior. The transactor circuit 32 is an interface circuit that exhibits the input/output behavior included in the first logic behavior.

The analyzing unit 1a verifies the logic behavior of an LSI using the logic circuit 31, the transactor circuit 32, and untimed behavior models which exhibit the first logic behavior in which no time related information is specified. In other words, the analyzing unit 1a verifies the LSI logic behavior using behavior models for the software-based first logic behavior of the LSI logic behavior while transferring data from/to the logic circuit 31. The transactor circuit 32 controls data transfer between the behavior model and the logic circuit 31. The analyzing unit 1a and the circuit board 2 are connected via a bus 4, such as a peripheral component interconnect (PCI). Data is transferred between the analyzing unit 1a and the circuit board 2 via the bus 4.

Figure 2:
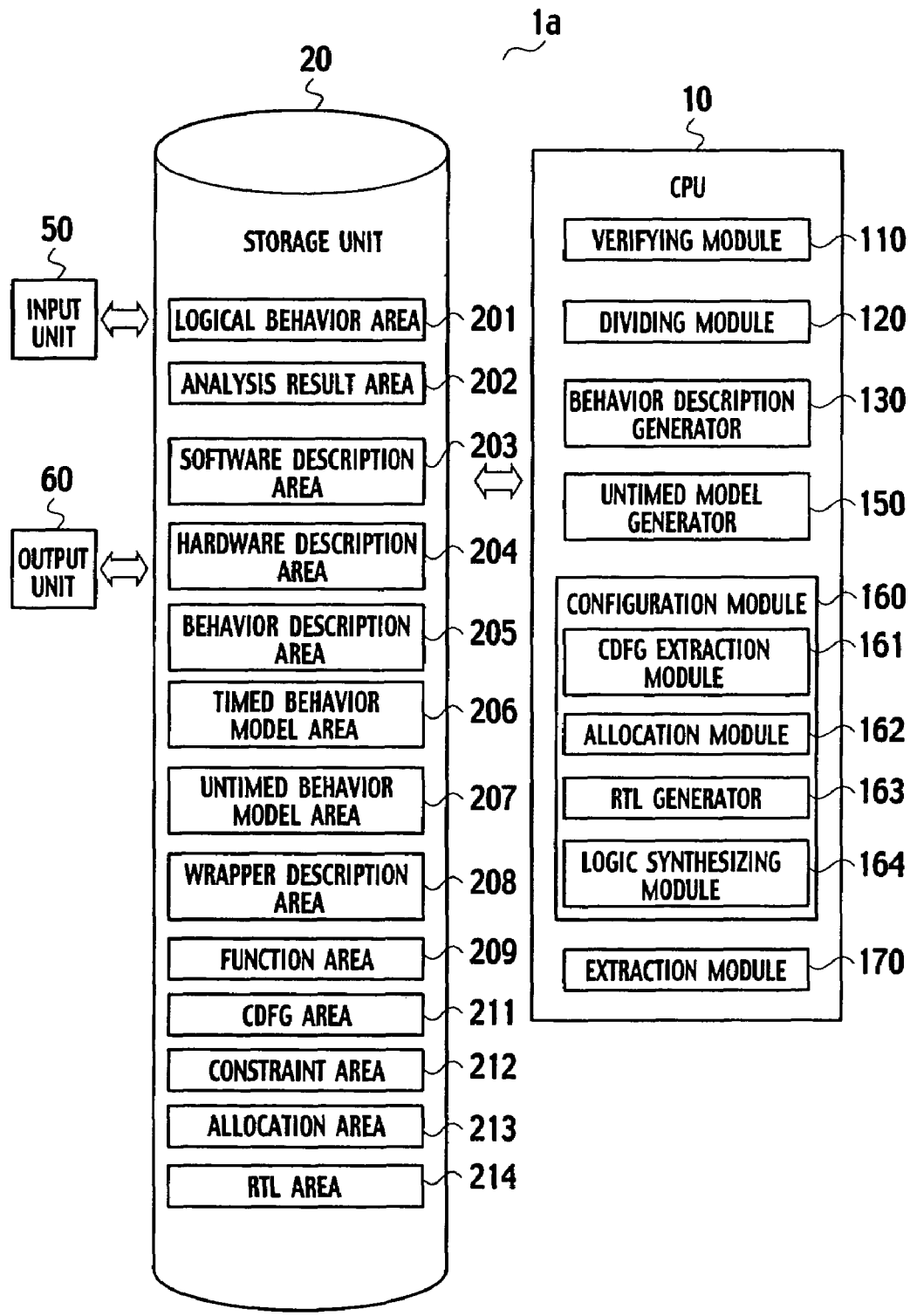
FIG. 2 shows a schematic structure illustrating a structure of an analyzing unit according to the first embodiment of the present invention.

As shown in FIG. 2, the analyzing unit 1a includes a central processing unit (CPU) 10, a storage unit 20, an input unit 50, and an output unit 60. In addition, the CPU 10 includes a verifying module 110, a dividing module 120, a behavior description generator 130, an untimed model generator 150, a configuration module 160, and an extraction module 170.

The verifying module 110 carries out logic behavior simulation and verifies simulation results. The dividing module 120 divides logic behavior into software-based first logic behavior and hardware-based second logic behavior. The behavior description generator 130 generates behavior descriptions from a file of LSI logic behavior descriptions. The untimed model generator 150 generates untimed behavior models based on the first logic behavior in which time related information is unspecified. The configuration module 160 generates circuit data of a circuit to be configured in the FPGA, which exhibits logic behavior, and configures the circuit in the FPGA 3 based on the circuit data. The circuit data includes gate-level circuit models or the like. The extraction module 170 extracts a transaction function from the first logic behavior. 'Transaction function' is a function describing data input/output behavior.

In addition, the configuration module 160 includes a CDFG extraction module 161, an allocation module 162, a RTL generator 163, and a logic synthesizing module 164. The CDFG extraction module 161 sets an order in which calculations and data accesses described in the behavior descriptions are carried out, and then extracts a control data flow graph (CDFG) from the behavior descriptions. The allocation module 162 carries out 'allocation', which allocates hardware resources and execution clock cycles to calculations described in the behavior description. The RTL generator 163 generates RTL models written in register transfer level (RTL) language. The logic synthesizing module 164 synthesizes gate-level circuit models based on the RTL models.

The storage unit 20 includes a logic behavior area 201, an analysis result area 202, a software description area 203, a hardware description area 204, a behavior description area 205, a timed behavior model area 206, an untimed behavior model area 207, a wrapper description area 208, a function area 209, a CDFG area 211, a constraint area 212, an allocation area 213, and an RTL area 214.

The logic behavior area 201 stores a logic behavior file in which a logic behavior description is written. The analysis result area 202 stores logic behavior simulation results. The software description area 203 stores a file of first logic behavior descriptions. The hardware description area 204 stores a file of second logic behavior descriptions. The behavior description area 205 stores behavior descriptions. The timed behavior model area 206 stores timed behavior models. The untimed behavior model area 207 stores untimed behavior models. The wrapper description area 208 stores a wrapper file of wrapper descriptions. The function area 209 stores transaction functions. The CDFG area 211 stores CDFG. The constraint area 212 stores constraints on behavior synthesis. The allocation area 213 stores allocation results. The RTL area 214 stores RTL models.

The input unit 50 includes a keyboard, a mouse, and a light pen or a flexible disk unit. A simulation operator may specify and set logic behavior and constraints via the input unit 50. In addition, a display, which displays simulation results, a printer, or a recording unit having a computer readable recording medium, which stores the simulation results, may be used as the output unit 60. Here, 'computer readable recording medium' means a medium capable of storing electronic data, such as external memory of a computer, semiconductor memory, a magnetic disk, an optical disk, a magnetic optical disk, and a magnetic tape. More specifically, a 'computer readable recording medium' may be a flexible disk, CD-ROM, or an MO disk.

First, an exemplary method for configuring a circuit in the FPGA 3 by the simulation system shown in FIGS. 1 and 2 is described using a flowchart of FIG. 3. According to the following working example, an RTL model is synthesized using behavior synthesis based on behavior descriptions stored in the behavior description area 205. A gate-level circuit model is generated from the RTL model.

In step S101 of FIG. 3, the CDFG extraction module 161 shown in FIG. 2 reads a behavior description from the behavior description area 205. The CDFG extraction module 161 extracts a CDFG from the behavior description. The extracted CDFG is stored in the CDFG area 211.

In step S102, the allocation module 162 reads the CDFG from the CDFG area 211. The allocation module 162 carries out allocation based on the CDFG. Note that the allocation module 162 carries out allocation based on constraints on an available number of resources and types of available hardware stored in the constraint area 212. The allocation results are stored in the allocation area 213.

In step S103, the RTL generator 163 reads the allocation results stored in the allocation area 213. The RTL generator 163 is connected between hardware resources via a multiplexer, thereby providing a data path. Afterwards, the RTL generator 163 generates a control circuit that generates a signal for controlling the data path. An RTL model is generated by the processing described above. The generated RTL models are stored in the RTL area 214.

In step S104, the logic synthesizing module 164 reads an RTL model from the RTL area 214. The logic synthesizing module 164 synthesizes circuit data based on the RTL model.

In step S104, the following method may be used for synthesizing circuit data by the logic synthesizing module 164. The logic synthesizing module 164 generates a gate-level circuit model based on the RTL model, and then generates circuit data resulting from conversion to a predetermined data format based on the circuit model. In addition, the logic synthesizing module 164 analyzes the generated circuit data, and then generates logic functionality setting data required for setting logic functionality of a circuit to be configured in the FPGA 3. By loading the generated logic functionality setting data into the FPGA 3, a circuit capable of operating based on a behavior description stored in the behavior description area 205 is configured in the FPGA 3.

In the case of writing logic behaviors in a language that provides hardware behavior descriptions such as descriptions written in a hardware description language (HDL) using C++ language, a main description of a logic behavior of an algorithm and a testing description for verifying the correctness of the algorithm are provided. A C/C++ compiler or the like is used to compile the main description and the testing description and verifies the logic behavior.

An example of logic behavior verification using the simulation system shown in FIGS. 1 and 2 and a simulation method shown in FIG. 4 is described forthwith. A case where an algorithm for a to-be-verified logic behavior is an advanced encryption standard (AES) algorithm is described below. AES is a U.S. standard encryption system.

In step S201 of FIG. 4, a logic behavior file, in which the main description and the testing description of the AES algorithm is written, is stored in the logic behavior area 201 via the input unit 50 shown in FIG. 2. FIG. 5 shows a part of an exemplary main description of the AES algorithm. FIG. 6 shows a part of a header for the main description in FIG. 5. In addition, FIG. 7 shows a part of an exemplary testing description for verifying the AES algorithm.

In step S202, the verifying module 110 reads the logic behavior file from the logic behavior area 201. The verifying module 110 then carries out logic behavior simulation based on the logic behavior file. Logic behavior simulation results are stored in the analysis result area 202.

In step S203, the verifying module 110 reads the logic behavior simulation results from the analysis result area 202. The verifying module 110 then verifies whether or not the simulated logic behavior is consistent with a required circuit behavior based on the logic behavior simulation results. For example, data resulting from encryption by the AES algorithm is decrypted, and is compared with the original data for determining whether it is consistent with original data. If the decrypted data is consistent with the original data, processing proceeds to step S204. Otherwise, if not, processing proceeds to step S221 in which the logic behavior of the algorithm is corrected. Afterwards, processing returns to the step S202.

Figure 8:
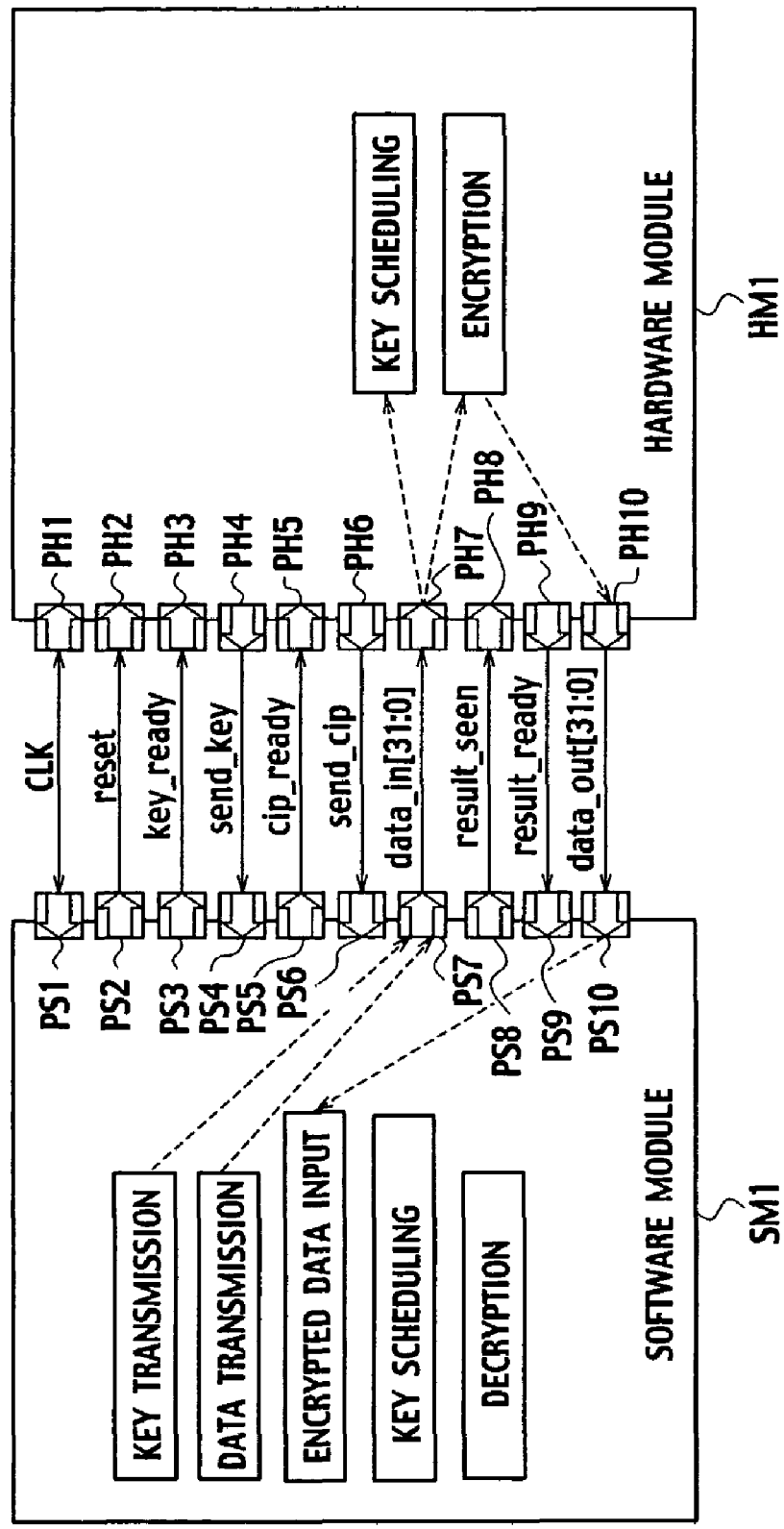
FIG. 8 is an example of dividing logic behavior into software-based logic behavior and hardware-based logic behavior using the simulation method according to the embodiment of the present invention.

In the step S204, the dividing module 120 reads the logic behavior file from the logic behavior area 201. The dividing module 120 divides logic behavior to be verified into first logic behavior and second logic behavior. Hereafter, a module of the first logic behavior is referred to as a 'software module SM1', and a module of the second logic behavior is referred to as a 'hardware module HM1'. FIG. 8 shows exemplary software module SM1 and hardware module HM1. Logic behavior of the software module SM1 may be transmission of an encryption key and data to be encrypted to the HM1, decrypt encrypted data or related processing. On the other hand, logic behavior of the hardware module HM1 may be to encrypt received data based on a received key. In FIG. 8, ports PS1 through PS10 are provided for the software module SM1. On the other hand, ports PH1 through PH10 are provided for the hardware module HM1. A plurality of data is transferred between the software module SM1 and the hardware module HM1 via the ports PS1 through PS10 and the ports PH1 through PH10. For example, a reset signal is transmitted from the software module SM1 via the port PS2, and is then received by the hardware module HM1 via the port PH2. In addition, a key and data to be encrypted are transmitted from the software module SM1 via the port PS7, and are then received by the hardware module HM1 via the port PH7. Encrypted data is transmitted from the hardware module HM1 via the port PH10, and is then received by the software module SM1 via the port PS10. A clock signal CLK is transmitted from a clock generating circuit, which is not shown in the drawing, to the software module SM1 via the port PS1 and to the hardware module HM1 via the port PH1 simultaneously. A software module file of software module SM1 logic behavior descriptions is stored in the software description area 203. In addition, a hardware module file of hardware module HM1 logic behavior descriptions is stored in the hardware description area 204.

In step S205, the behavior description generator 130 reads the hardware module file from the hardware description area 204. The behavior description generator 130 generates a logic behavior description of the hardware module HM1 based on the hardware module file. The generated behavior description includes an input/output behavior description for data transfer from/to the software module SM1 shown in FIG. 8 and a description of input/output terminals or the like through which transferred data passes. The behavior description of the hardware module HM1 may be written in HDL. Generation of behavior description decreases the abstraction level of logic behaviors, allowing further specific hardware verification. The generated behavior descriptions are stored in the behavior description area 205. FIG. 9 shows a part of an exemplary main description of the behavior description of the hardware module HM1 written in a language that also permits hardware behavior descriptions such as descriptions written in HDL using C++ language. FIG. 10 shows a part of a header for the main description in FIG. 9. FIG. 11 shows a part of an exemplary main description of the testing description for verifying the AES algorithm. Since the abstraction levels of logic behavior descriptions to be tested are different, the description of FIG. 11 is different from the description of FIG. 7. FIG. 12 shows a part of a header for the main description in FIG. 11. Of the testing description, the hardware module HM1 behavior description is provided; however, the software module SM1 behavior description is not provided. Thus, description is required of inter-module connection for corresponding input/output behavior described by the hardware module HM1 with input/output behavior described by the software module SM1. FIG. 13 shows a part of an exemplary description of an inter-module connection.

In step S206, a timed behavior model is generated based on descriptions in the software module file. The timed behavior model is a behavior model that operates in sync with an operating clock, for example. Therefore, a timed behavior model is written in a language that permits time-based control descriptions and provision of hardware behavior descriptions, such as descriptions written in HDL using C++ language. When generating a timed behavior model of the software module SM1, input/output behavior descriptions for data transfer from/to the hardware module HM1 shown in FIG. 8 are provided. The generated timed behavior models are stored in the timed behavior model area 206.

In step S207, the verifying module 110 reads the behavior description from the behavior description area 205, and also reads the timed behavior model from the timed behavior model area 206. The verifying module 110 carries out logic behavior simulation based on the behavior description and the timed behavior model. The logic behavior simulation results are stored in the analysis result area 202.

In step S208, the verifying module 110 reads the logic behavior simulation results from the analysis result area 202. The verifying module 110 verifies whether or not the simulated logic behavior is consistent with a required circuit behavior based on the logic behavior simulation results. For example, data resulting from encryption by the AES algorithm is decrypted, and is then compared with the original data for determining whether it is consistent with the original data. If the decrypted data is consistent with the original data, processing proceeds to step S209. If the calculation result is not consistent with an expected value, processing returns to the step S204. Verification of behavior descriptions in the steps S207 and S208 are carried out for verifying processing in the steps S204 through S206.

In step S209, the configuration module 160 reads the behavior description from the behavior description area 205. The configuration module 160 generates an RTL model of the logic circuit 31 based on the behavior description. Afterwards, the configuration module 160 generates a gate-level circuit model of the logic circuit 31 based on the RTL model. The configuration module 160 then loads logic functionality setting data generated from the circuit model into the FPGA 3, thereby configuring the logic circuit 31 in the FPGA 3, as shown in FIG. 1. FIG. 14 shows a wrapper description that is generated from input/output information of the hardware module HM1 while generating circuit data of the logic circuit 31 to be configured in the FPGA 3. The wrapper description includes module names, input terminal names, and input/output terminal names of the logic circuit 31 to be configured in the FPGA 3. For example, the ports PH1 through PH10 shown in FIG. 8 are written as input terminals or output terminals. The wrapper description is used for the logic circuit 31 configured in the FPGA 3 to behave the same as the behavior provided in the behavior description. In other words, accessing the wrapper description allows input/output behavior from/to the hardware module HM1 written in the behavior description to be carried out as input/output behavior of the logic circuit 31 configured in the FPGA 3. The wrapper file of wrapper descriptions is stored in the wrapper description area 208 shown in FIG. 2.

In step S210, the verifying module 110 reads the timed behavior model from the timed behavior model area 206, the behavior description from the behavior description area 205, and the wrapper file from the wrapper description area 208. The verifying module 110 carries out collaborative logic behavior simulation using the timed behavior model and the logic circuit 31 configured in the FPGA 3. According to the collaborative simulation using a timed behavior model, the logic circuit 31 halts every clock cycle and then allows data transfer between the analyzing unit 1a and the logic circuit 31. In addition, the timed behavior model halts every clock cycle and data transfer between the logic circuit 31 and the analyzing unit 1a is then carried out. Therefore, the execution speed of the collaborative simulation using a timed behavior model is limited to be equal to or less than the operating speed of the analyzing unit 1a. Typically, the operating speed of the analyzing unit 1a is much slower than the maximum speed of a circuit configured in the FPGA 3. Therefore, the collaborative simulation using a timed behavior model cannot take advantage of the operating speed of the FPGA 3. The collaborative simulation results are stored in the analysis result area 202.

In step S211, the verifying module 110 reads the collaborative simulation results from the analysis result area 202. The verifying module 110 verifies whether or not the logic behavior is consistent with a required circuit behavior based on the collaborative simulation results. For example, data resulting from encryption by the AES algorithm is decrypted and is then compared for determining whether it is consistent with the received original data. If the decrypted data is consistent with the original data, processing proceeds to step S212. If the calculation result is not consistent with an expected value, the behavior description is examined. Afterwards, processing then returns to the step S209. The collaborative simulation using a timed behavior model is carried out for verifying the behavior of the logic circuit 31 configured in the FPGA 3. If the algorithm needs to be corrected, processing then proceeds to step S221. Otherwise, processing returns to the step S204 in which re-division of logic behavior into software-based logic behavior and hardware-based logic behavior is then analyzed.

In step S212, the extraction module 170 reads the software module file from the software description area 203. The extraction module 170 extracts all transaction functions including descriptions of transactions between the software module SM1 and the hardware module HM1 from the software module file. 'Transaction' refers to data transfer between a module and an external module. Therefore, the extracted transaction functions describe data input/output behavior between a module and an external module. In addition, description of transaction functions as a single module is referred to as a 'transactor'. FIG. 15 shows a part of an exemplary transaction function description extracted from the testing description shown in FIG. 11. Note that the extraction module 170 deletes, from the descriptions of the extracted transaction functions, descriptions unrelated to a circuit behavior such as a print statement for providing simulation results. Furthermore, the extraction module 170 performs processing such as declaration of arguments and variables within the transaction functions needed for executing those transaction functions. The extracted transaction functions are stored in the function area 209.

In step S213, the configuration module 160 generates circuit data of transactor circuit 32, which exhibits input/output behavior in the hardware module HM1, based on the transaction function descriptions stored in the function area 209. More specifically, the configuration module 160 generates a behavior description of the input/output behavior, and generates an RTL model of the transactor circuit 32 from the behavior description using a method to be described later. The configuration module 160 then generates a gate-level circuit model of the transactor circuit 32 by logic synthesis. The configuration module 160 loads logic functionality setting data, generated from the circuit model, into the FPGA 3, thereby configuring the transactor circuit 32 in the FPGA 3, as shown in FIG. 1.

In step S214, the untimed model generator 150 reads the software module file from the software description area 203. The untimed model generator 150 generates an untimed behavior model based on descriptions in the software module file. The untimed behavior model specifies an execution order according to the relationship of data reception and transmission. The generated untimed behavior model is stored in the untimed behavior model area 207. FIG. 16 shows a part of an exemplary call description which calls a transactor from the untimed behavior model when carrying out data transfer between the untimed behavior model and the logic circuit 31. The transactor is a description of transaction functions as a single module. The transactor circuit 32 is configured in the FPGA 3 as a transactor execution circuit. Therefore, once the untimed behavior model calls the transactor, data transfer between the untimed behavior model and the logic circuit 31 is carried out via the transactor circuit 32.

In step S215, the verifying module 110 reads the untimed behavior model from the untimed behavior model area 207, and also reads a behavior description from the behavior description area 205. The verifying module 110 carries out collaborative simulation using the untimed behavior model, the transactor circuit 32 and the logic circuit 31 configured in the FPGA 3. According to the collaborative simulation using the transactor circuit 32, data transfer between the untimed behavior model and the logic circuit 31 should be carried out only as necessary. In other words, different from the collaborative simulation carried out in the step S210, the collaborative simulation carried out in the step S215 does not allow data transfer between the untimed behavior model and the logic circuit 31 in each clock cycle. Therefore, irrespective of the operating speed of the analyzing unit 1a, the transactor circuit 32 and the logic circuit 31, configured in the FPGA 3, carry out high-speed operations. The collaborative simulation results are stored in the analysis result area 202.

In step S216, the verifying module 110 reads the collaborative simulation results from the analysis result area 202. The verifying module 110 verifies whether or not the logic behavior is consistent with a required circuit behavior based on the collaborative simulation results. The collaborative simulation using the untimed behavior model is carried out for extracting a transaction function and verifying the behavior of the transactor circuit 32.

Next, a method of generating an RTL model of the transactor circuit 32 in the step S213 is described using a flowchart of FIG. 17.

In step S301 of FIG. 17, the CDFG extraction module 161 shown in FIG. 2 reads all transaction functions stored in the function area 209. The CDFG extraction module 161 analyzes the description of each transaction function, and extracts a CDFG of the transaction function which indicates dependence among variables in the transaction function descriptions. The extracted CDFG is stored in the CDFG area 211.

In step S302, the allocation module 162 reads the CDFG of the transaction function from the CDFG area 211. The allocation module 162 then allocates hardware resources and execution clock cycles to behaviors described in the transaction function based on the CDFG of the transaction function and the constraints read from the constraint area 212. The allocation results are stored in the allocation area 213. FIG. 18 shows a part of an exemplary description of the constraints. The constraints include information specifying transactor behavior. More specifically, the constraints include information, such as the number and names of transaction functions that provide the constraints, names of transactors to be generated, types of ports to be used by the transactors, data bit width, correspondence of data signals and bit specification to variables in transaction functions, and specification of state transitions among the transaction functions. Under the constraints shown in FIG. 18, as specified in a line indicated by an arrow in the drawing, the number of transactors generated is restricted to one. 'State machine' is a circuit in which a subsequent state and output signal values depend on the present state and input signal values. For example, a sequential logic circuit, such as a register, includes flip-flops that may be used as a state machine.

In step S303, as with the processing described in the step S103 of FIG. 3, the RTL generator 163 generates an RTL model based on the allocation results read from the allocation area 213. In other words, the RTL generator 163 connects between hardware resources via a multiplexer, and generates a control circuit that generates a data path control signal. According to the constraints shown in FIG. 18, an RTL model represented by a single state machine is generated. The generated RTL model is stored in the RTL area 214.

As described above, the collaborative simulation using the untimed behavior model, the transactor circuit 32 and the logic circuit 31, configured in the FPGA 3, can be carried out at a higher speed than collaborative simulation using the timed behavior model and the logic circuit 31. Therefore, even when using a more complex testing pattern for the collaborative simulation carried out in the step S215 than collaborative simulation carried out in the step S215, simulation time does not increase.

As described above, the simulation system shown in FIGS. 1 and 2 automatically generates the transactor circuit 32 that carries out data transfer between the untimed behavior model and the logic circuit 31. Then the simulation system reduces the transactor circuit 32 generating time. As a result, the logic behavior verifying time may decrease. In addition, use of the transactor circuit 32 allows high-speed operation of the logic circuit 31, irrespective of the operating speed of the analyzing unit 1a. In other words, even if complex testing for careful logic behavior verification is carried out, verification time is not increased.

Modified Example

In FIG. 17, an example of generating an RTL model under constraints, such as only one transactor being specified in the description shown in FIG. 18 is described. Constraints, which are part of the descriptions shown in FIG. 19, include three transactors to be generated as specified in a line indicated by an arrow in the drawing. Therefore, an RTL model generated based on the constraints shown in FIG. 19 uses three state machines. The state machines operate independently. Therefore, a plurality of transaction functions with respective behavior are assigned to a plurality of state machines and the plurality of transaction functions are concurrently and independently preformed. Generation of an RTL model using a plurality of state machines allows pipeline operations of the hardware module HM1 and verification of concurrent logic behavior, such as concurrent data reception and transmission. When specifying generation of a plurality of transactors, description of information specifying behavior of each transactor should be provided as constraints.

In addition, according to the description of the aforementioned simulation method, the structure of FIG. 8 is shown as an example of dividing logic behavior into the software module SM1 and the hardware module HM1. Different from the structure shown in FIG. 8, the software module SM1 shown in FIG. 20 further including a port PS11 and the hardware module HM1 further including a port PH11.

According to the structure shown in FIG. 8, a key and data are transmitted from the software module SM1 via the port PS7 and then received by the hardware module HM1 via the port PH7. According to the structure shown in FIG. 20, a key is transmitted from the software module SM1 via the port PS11 and then received by the hardware module HM1 via the port PH11. As with the case of the structure shown in FIG. 8, data is transmitted from the software module SM1 via the port PS7 and then received by the hardware module via the port PH7.

Figure 20:
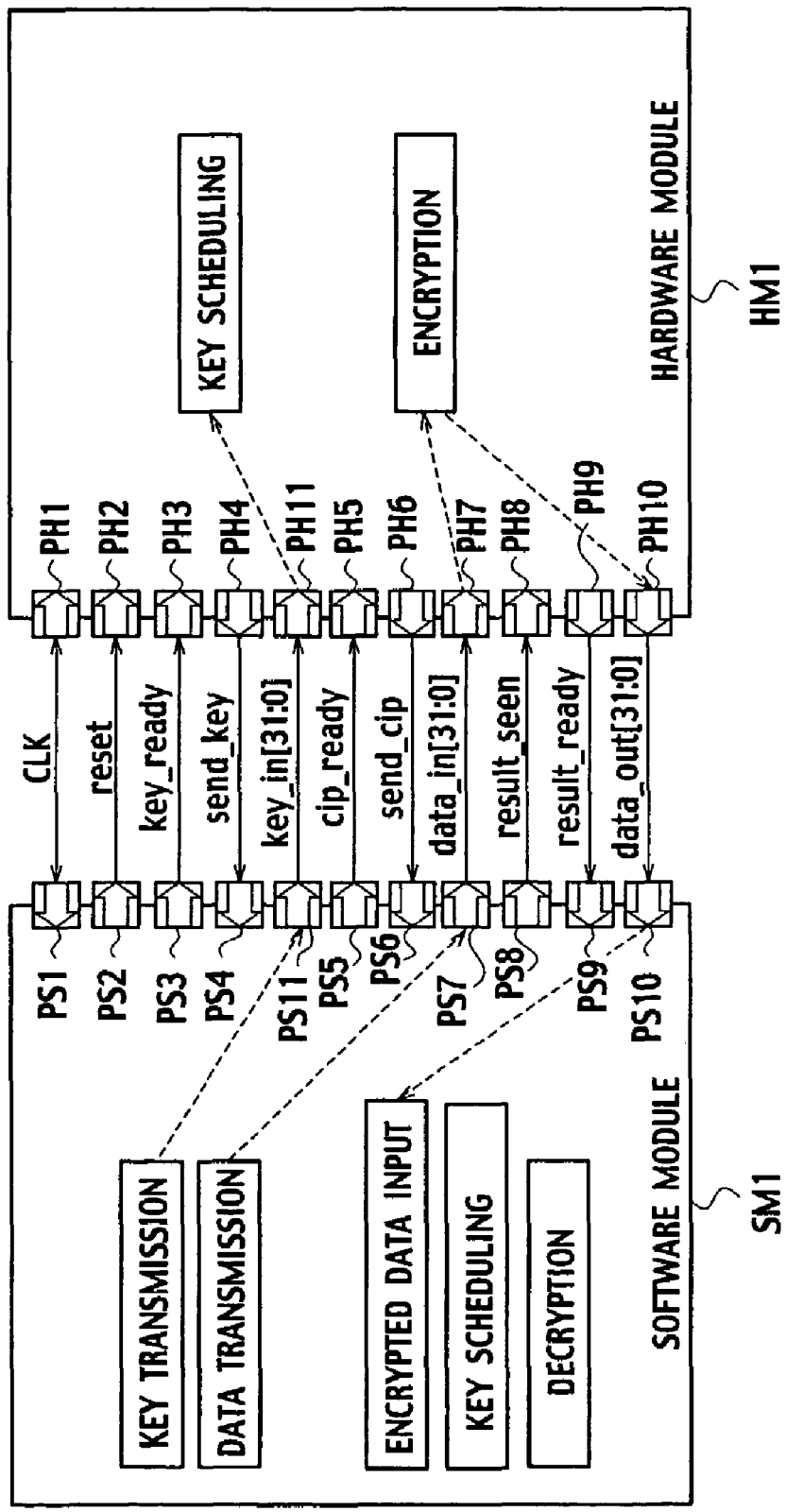
FIG. 20 shows an example of dividing logic behavior into software-based logic behavior and hardware-based logic behavior according to the simulation method of the first embodiment of the present invention.

Accordingly, use of the structure shown in FIG. 20 and specification of constraints, such as generating a plurality of transactors to permit generation of the transactor circuit 32 with key and data reception as individual transactors and verification of logic behavior for concurrently receiving the key and data.

Second Embodiment

Figure 21:
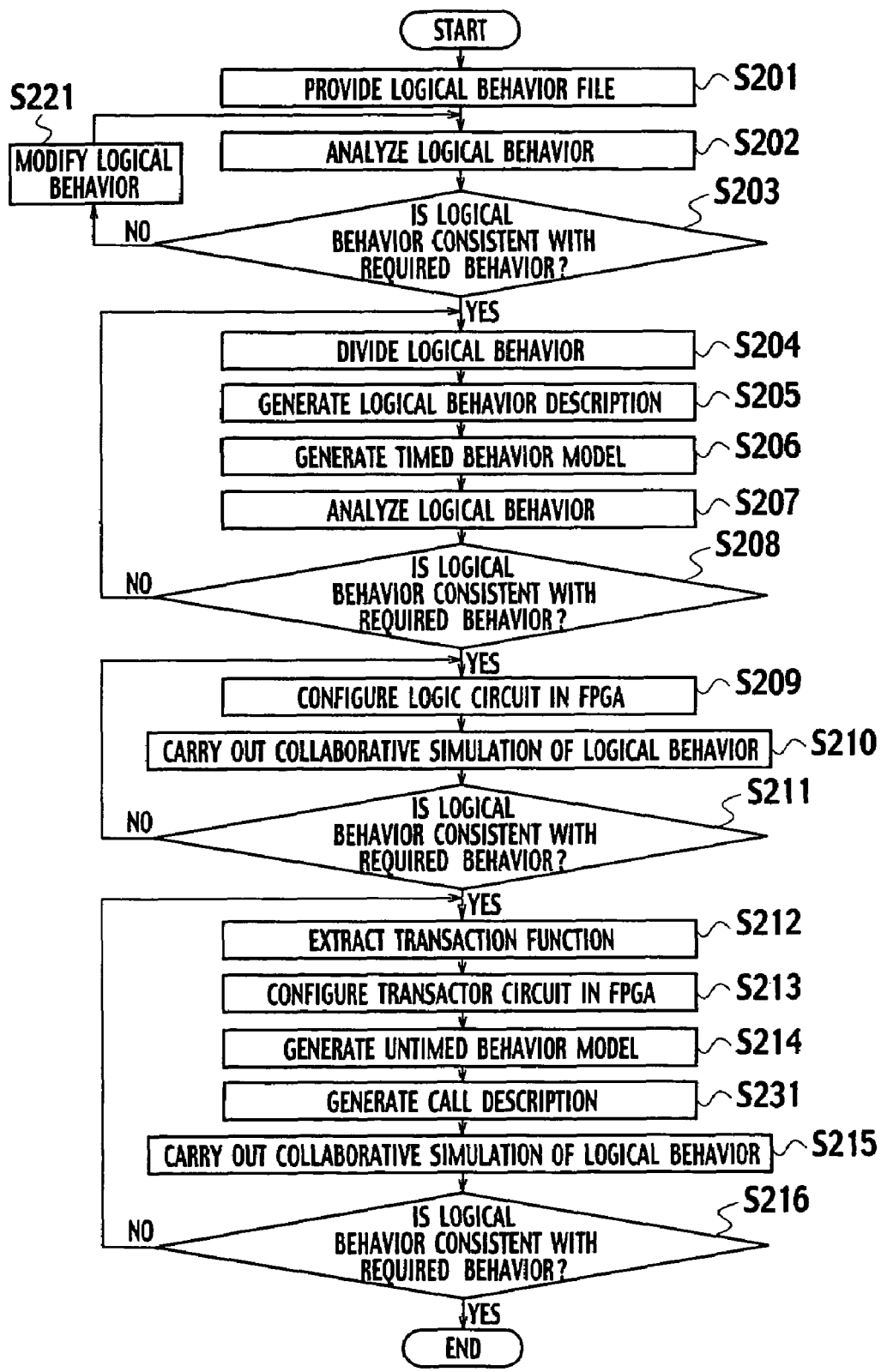
FIG. 21 is a flowchart explaining a simulation method according to a second embodiment of the present invention.

As shown in FIG. 21, different from the simulation method of FIG. 4, the simulation system according to a second embodiment of the present invention further includes a step S131 of generating a call description which calls a transactor from the untimed behavior models. The simulation shown in FIG. 21 may be carried out by a simulation system having an analyzing unit 1b shown in FIG. 22. As is different from FIG. 2, the analyzing unit 1b comprises a CPU 10 which further includes a call description generator 180. As described in the step S214 of FIG. 4, the call description is a description to call a transactor from the untimed behavior model. The call description generator 180 generates a call description from the transaction function descriptions.

Figure 22:
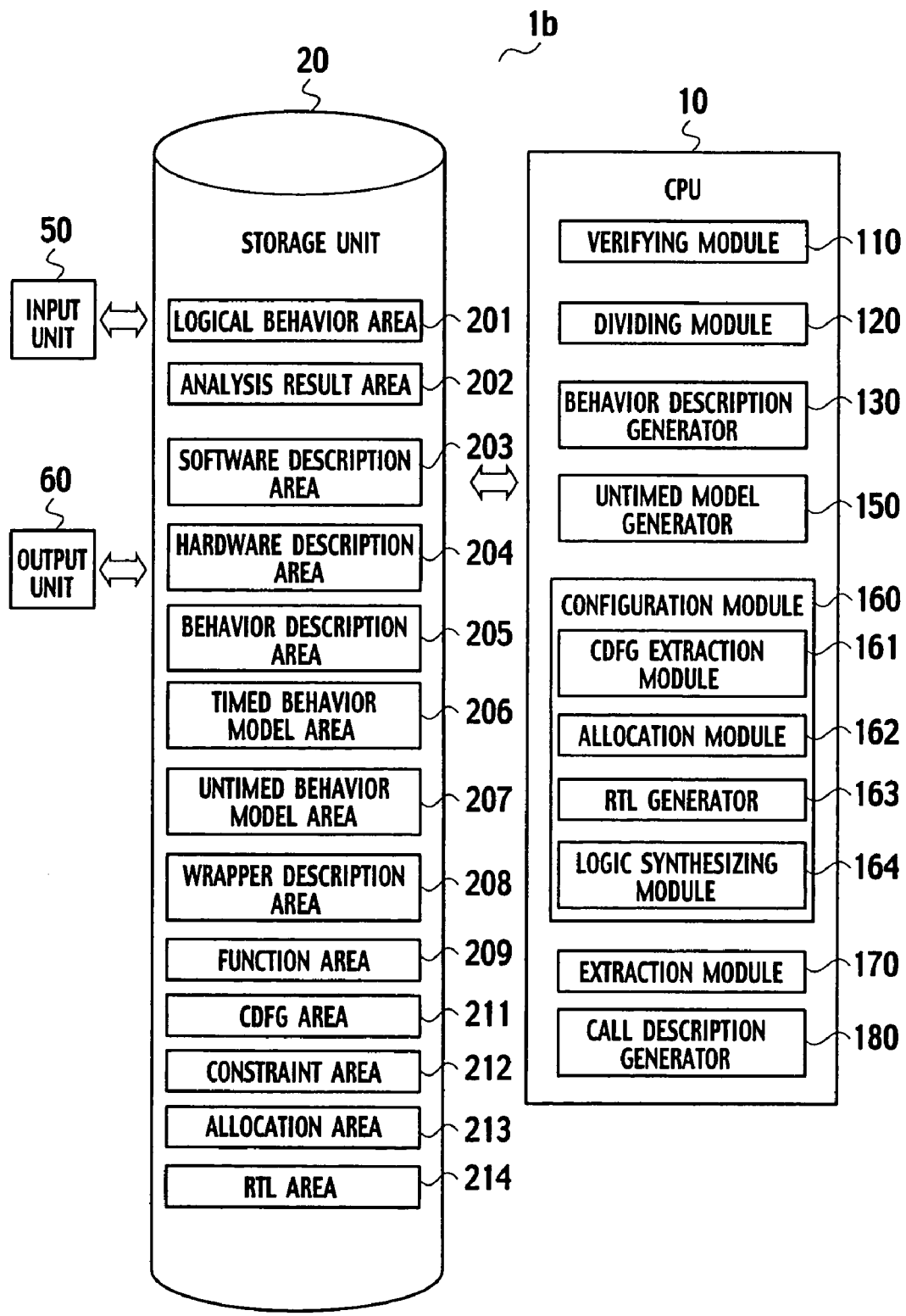
FIG. 22 shows a schematic structure illustrating a structure of an analyzing unit which operates according to the simulation method of the second embodiment of the present invention.

In the step S231 shown in FIG. 21, the call description generator 180, shown in FIG. 22, reads an untimed behavior model from the untimed behavior model area 207, and also reads a transaction function from the function area 209. The call description generator 180 rewrites transaction function description in the untimed behavior model into a call description which calls a transactor based on the transaction function description. The rewritten untimed behavior model is stored in the untimed behavior model area 207. Other elements and functions of the second embodiment are substantially the same as the first embodiment, and repetitive description is thus omitted.

The simulation method, according to the second embodiment, allows automatic generation of a call description for calling a transactor from an untimed behavior model. This procedure allows further reduction in logic behavior verification time.

Other Embodiments

In the descriptions of the aforementioned first and the second embodiment, an exemplary collaborative simulation using a single FPGA 3 is described. Alternatively, a plurality of FPGAs may be used. Use of the plurality of FPGAs allows hardware to simulate larger-scale logic behaviors.

Various modifications will become possible for those skilled in the art after receiving the teachings of the present disclosure without departing from the scope thereof.

What is claimed is:

1. A simulation system for verifying logic behavior of a semiconductor integrated circuit, comprising:
   a reprogrammable semiconductor device comprising an interface circuit and a logic circuit that are configured in the reprogrammable semiconductor device; and
   an analyzing unit configured to divide a logic behavior of the semiconductor integrated circuit into a software-based first logic behavior and a hardware-based second logic behavior and to generate circuit data of the interface circuit that exhibits an input/output behavior included in the first logic behavior and circuit data of the logic circuit that exhibits the second logic behavior;
   wherein the analyzing unit verifies the logic behavior of the semiconductor integrated circuit by using an untimed behavior model exhibiting the first logic behavior in which time related information is unspecified, the logic circuit, and the interface circuit, wherein the interface circuit carries out data transfer between the untimed behavior model and the logic circuit.

2. The system of claim 1, wherein the analyzing unit further comprises:
   a configuring module which configures the interface circuit and the logic circuit in the reprogrammable semiconductor device, based on the circuit data of the interface circuit and the circuit data of the logic circuit.

3. The system of claim 1, wherein the analyzing unit further comprises:
   a behavior description generator configured to generate behavior description from a file of the semiconductor integrated circuit logic behavior descriptions.

4. The system of claim 3, wherein the analyzing unit generates the circuit data of the interface circuit and the circuit data of the logic circuit, based on the behavior description, so as to satisfy a constraint.

5. The system of claim 4, wherein the constraint is a number of state machines of which a subsequent state and an output signal value are determined, based on the present state and an input signal value.

6. The system of claim 1, wherein the analyzing unit further comprises:
   an untimed model generator configured to generate the untimed behavior model based on the first logic behavior.

7. The system of claim 1, wherein the analyzing unit further comprises:
   an extracting module configured to extract a function describing the input/output behavior from the first logic behavior.

8. The system of claim 7, wherein the analyzing unit generates a behavior description of the input/output behavior based on a description of the function.

9. The system of claim 7, wherein the analyzing unit further comprises:
   a call description generator configured to generate a call description, which calls the function from the untimed behavior model, based on the description of the function.

10. A simulation method for verifying logic behavior of a semiconductor integrated circuit, comprising:
    dividing a logic behavior of the semiconductor integrated circuit into a software-based first logic behavior and a hardware-based second logic behavior;
    generating circuit data of a logic circuit exhibiting the second logic behavior, and configuring the logic circuit in a reprogrammable semiconductor device, based on the circuit data of the logic circuit;
    generating circuit data of an interface circuit exhibiting input/output behavior included in the first logic behavior, and configuring the interface circuit in the reprogrammable semiconductor device, based on the circuit data of the interface circuit; and
    verifying the logic behavior of the semiconductor integrated circuit by using an untimed behavior model exhibiting the first logic behavior in which time related information is unspecified, the logic circuit, and the interface circuit, wherein the interface circuit carries out data transfer between the untimed behavior model and the logic circuit.

11. The method of claim 10, further comprising:
    verifying the logic behavior of the semiconductor integrated circuit using the logical circuit and a timed behavior model exhibiting the first logic behavior in which time related information is specified.

12. The method of claim 10, further comprising:
    generating behavior descriptions of the first and the second logic behavior, respectively, so as to satisfy a constraint based on a file of the semiconductor integrated circuit logic behavior descriptions.

13. The method of claim 12, wherein the constraint is a number of state machines of which a subsequent state and an output signal value are determined, based on the present state and an input signal value.

14. The method of claim 12, further comprising:
    verifying the logic behavior of the semiconductor integrated circuit using the behavior description of the second logic behavior and a timed behavior model exhibiting the first logic behavior in which time related information is specified.

15. The method of claim 12, wherein the untimed behavior model is generated based on the behavior description of the first logic behavior.

16. The method of claim 12, wherein the circuit data of the logic circuit is generated based on the behavior description of the second logic behavior.

17. The method of claim 10, further comprising:
    extracting a function describing the input/output behavior from the first logic behavior.

18. The method of claim 17, wherein the circuit data of the interface circuit is generated based on a description of the function.

19. The method of claim 17, further comprising:
    generating a call description, which calls the function from the untimed behavior model, based on the description of the function.

20. A computer program product stored on a computer-readable medium of a computer for verifying logic behavior of a semiconductor integrated circuit, the computer program product comprising:

instructions configured to divide a logic behavior of the semiconductor integrated circuit into a software-based first logic behavior and a hardware-based second logic behavior;

instructions configured to generate circuit data of a logic circuit exhibiting the second logic behavior, and configure the logic circuit in a reprogrammable semiconductor device, based on the circuit data of the logic circuit;

instructions configured to generate circuit data of an interface circuit exhibiting input/output behavior included in the first logic behavior, and configuring the interface circuit in the reprogrammable semiconductor device, based on the circuit data of the interface circuit; and instructions configured to verify the logic behavior of the semiconductor integrated circuit by using an untimed behavior model exhibiting the first logic behavior in which time related information is unspecified, the logic circuit, and the interface circuit, wherein the interface circuit carries out data transfer between the untimed behavior model and the logic circuit.

* * * * *